United States Patent [19]
Roetcisoender et al.

[11] Patent Number: 5,654,898
[45] Date of Patent: Aug. 5, 1997

[54] TIMING-DRIVEN INTEGRATED CIRCUIT LAYOUT THROUGH DEVICE SIZING

[75] Inventors: Bradley R. Roetcisoender, Kirkland; Yongtao You; Richard K. McGehee, both of Bellevue, all of Wash.

[73] Assignee: Cascade Design Automation Corporation, Bellevue, Wash.

[21] Appl. No.: 500,579

[22] Filed: Jul. 11, 1995

Related U.S. Application Data

[63] Continuation of Ser. No. 60,573, May 10, 1993, abandoned

[51] Int. Cl.$^6$ .................................................. G06F 17/50
[52] U.S. Cl. ...................... 364/490; 364/488; 364/489; 364/491
[58] Field of Search ................................ 364/488–491, 364/578

[56] References Cited

U.S. PATENT DOCUMENTS

| | | | |
|---|---|---|---|
| 4,263,651 | 4/1981 | Donath et al. | 364/300 |
| 4,630,219 | 12/1986 | DiGiacomo et al. | 364/488 |
| 4,694,403 | 9/1987 | Nomura | 364/488 |
| 4,698,760 | 10/1987 | Lembach et al. | 364/490 |
| 4,827,428 | 5/1989 | Dunlop et al. | 364/491 |
| 4,970,664 | 11/1990 | Kaiser et al. | 364/521 |
| 5,003,487 | 3/1991 | Drumm et al. | 364/489 |
| 5,126,950 | 6/1992 | Rees et al. | 364/490 |
| 5,197,015 | 3/1993 | Hartoog et al. | 364/490 |
| 5,208,764 | 5/1993 | Rusu et al. | 364/491 |
| 5,218,551 | 6/1993 | Agrawal et al. | 364/491 |
| 5,235,521 | 8/1993 | Johnson et al. | 364/489 |
| 5,237,514 | 8/1993 | Curtin | 364/490 |
| 5,278,769 | 1/1994 | Bair et al. | 364/490 |
| 5,282,148 | 1/1994 | Poirot et al. | 364/491 |
| 5,406,498 | 4/1995 | Yabe | 364/491 |
| 5,422,317 | 6/1995 | Hua et al. | 437/250 |
| 5,459,673 | 10/1995 | Carmean et al. | 364/489 |

OTHER PUBLICATIONS

Chan, "Algorithms for Library–Specific Sizing of Combinational Logic", *27th ACM/IEEE Design Automation Conference*, 1990, Paper 21.4, pp. 353–356.

Chen et al., "A New Circuit Optimization Technique for High Performance CMOS Circuits", *IEEE Transactions on Computer–Aided Design*, vol. 10, No. 5, May 1991, pp. 670–677.

Date et al., "Hierarchical Module Generation Technique for a High Performance Memory Macrocell", *IEICE Transactions*, vol. E 74, No. 4, Apr. 1991, pp. 938–944.

Donath et al., "Timing Driven Placement Using Complete Path Delays", *27th ACM/IEEE Design Automation Conference*, 1990, Paper 6.1, pp. 84–89.

Hinsberger et al., "A Cell–Based Approach to Performance Optimization of Fanout–Free Circuits", *IEEE Transactions on Computer–Aided Design*, vol. 11, No. 10, Oct. 1992, pp. 1317–1321.

Lin et al., "Delay and Area Optimization in Standard–Cell Design", *27th ACM/IEEE Design Automation Conference*, 1990, Paper 21.3, pp. 349–352.

Obermeier et al., "Combining Circuit Level Changes with Electrical Optimization", *1988 International Conference on Computer–Aided Design*, pp. 218–221.

(List continued on next page.)

*Primary Examiner*—Kevin J. Teska
*Assistant Examiner*—Leigh Marie Garbowski
*Attorney, Agent, or Firm*—Robert M. Storwick

[57] ABSTRACT

A method and apparatus for determining the layout of an integrated circuit, in accordance with timing constraints, by means of sizing the buffers in the layout. A nominal netlist for the layout of the integrated circuit is used to determine critical paths through the circuit. The time-critical paths are determined and the instances of the buffers along the path are resized so that the time delays in the time-critical paths are either brought within the predetermined timing criteria, or no further improvement in any time-critical path is possible.

16 Claims, 4 Drawing Sheets

OTHER PUBLICATIONS

Richman et al., "A Deterministic Algorithm for Automatic CMOS Transistor Sizing", *IEEE Journal of Solid-State Circuits,* vol. 23, No. 1, Apr. 1988, pp. 522–526.

Smith et al., "Cell Libraries and Assembly Tools for Analog/Digital CMOS and BiCMOS Application-Specific Integrated Circuit Design", *IEEE Journal of Solid-State Circuits,* vol. 24, No. 5, Oct. 1989, pp. 1419–1432.

Upton et al., "Integrated Placement for Mixed Macro Cell and Standard Cell Designs", *27th ACM/IEEE Design Automation Conference,* 1990, Paper 2.3, pp. 32–35.

Dunlop et al., "Chip Layout Optimization Using Critical Path Weighting", 21st Design Automation Conference, 1984, pp. 133–136.

Teig et al., "Timing-Driven Layout of Cell-Based ICs," *VLSI Systems Design,* May 1986, pp. 63–73.

Prasitjutrakul et al., "Path-Delay Constrained Floorplanning: A Mathematical Programming Approach For Initial Placement," 26th ACM/IEEE Design Automation Conference, 1989, pp. 364–369.

Jackson et al., "A Fast Algorithm For Performance-Driven Placement," 1990 IEEE, pp. 328–331.

Tsay et al., "An Analytic Net Weighting Approach For Performance Optimization In Circuit Placement," 28th ACM/IEEE Design Automation Conference, 1991, pp. 620–625.

Luk, "A Fast Physical Constraint Generator For Timing Driven Layout," 28th ACM/IEEE Design Automation Conference, 1991, pp. 626–631.

TIMING-DRIVEN INTEGRATED CIRCUIT LAYOUT THROUGH DEVICE SIZING

This application is a continuation of application Ser. No. 08/060,573, filed May 10, 1993, the benefit of the filing dates of which are hereby claimed under 35 USC 120 now abandoned.

This invention is a method and apparatus for developing a performance-driven layout of a cell-based integrated circuit. The initial specification of performance goals and post-layout timing analysis are used to drive module generation and physical layout tools. Communication between the analysis and the physical layout tools allows a new buffer sizing method to perform static timing analysis on the network under modification. The resulting designs are developed based on accurate delay data rather than estimations.

Automated layout is key to coping with the increasing complexity of designs. High-quality layout is key to high-performance design. Automated placement and routing tools have made the design of large gate arrays possible with reduced development time: the next step is to bring automation to cell-based layout design. Cell-based layout design has several more dimensions of flexibility than gate array layout design and brings new challenges and opportunities that do not exist in gate array design. Included among these challenges is an increased incidence of problems with establishing proper timing among the signals in the layout design.

The present invention integrates three key disciplines to optimize integrated circuit layouts based on performance constraints: cell layout, physical design, and timing analysis. A significant novel feature of the present invention is that it uses the results of the timing analysis and the cell layout iteratively to produce an optimally laid-out integrated circuit that meets predetermined timing constraints. The optimization criterion is to minimize chip area and power consumption while meeting chip performance goals. The criterion is satisfied by dealing with the paths in the net list for the integrated circuit which fail to meet the timing constraints.

This invention uses module generators to perform the steps necessary for the generation of cell layout and simulation data. Since the cells are chosen from a library, and the library is created under the control of a computer program, it is possible for the computer program to generate new versions of cells with modified device sizes so that the modified-size devices provide altered cell output drive characteristics. In one embodiment, this modification of device sizing to change output drive is called buffer sizing.

The physical design steps of the system provide tools for fully automatic placement and routing of various types of cells, including datapaths, macro blocks, standard cells and I/O pads. Each of these various types of cells is handled with programs that are tailored to the cell characteristics. The overall flow of these programs is automatic, with each tool being invoked in the proper sequence.

The third discipline necessary for performance-driven layout is circuit timing analysis. In one version the present invention relies on accurate analysis of path delay by means of a static (pattern-independent) timing analyzer.

The present invention analyzes the layout of an integrated circuit, runs timing analyses, selects drive requirements, and calls the module generators to build cells with the appropriate output drive. A shared internal data structure used by the program ensures that the communication cost between the buffer sizing tool and the timing analyzer is kept low.

Past work in timing-driven layout includes tools that consider timing constraints during placement. These are described in "Timing Driven Placement Using Complete Path Delays," *27th Design Automation Conference*, pp. 84–89, 1990, by W. E. Donath, et al. The past work also includes tools that size devices in cell layouts. These are disclosed in "An Electrical Optimizer that Considers Physical Layout," *25th Design Automation Conference*, pp. 453–459, 1988, by F. W. Obermeier and R. H. Katz, and in "A New Circuit Optimization Technique for High Performance CMOS Circuits," *IEEE Trans. Computer-Aided Design*, vol. 10, no. 5, pp. 670–677, May 1991, by H. Y. Chen and S. Kang. Tools that rely on placement and routing for resolution of timing constraints cannot take advantage of the large amount of control that device sizing has over path delay. The approaches taken by tools that size individual devices in cell layouts involve use of the global search methods that require cell synthesis techniques and cannot handle the large complexities of full chip layouts.

Other approaches to layout optimization through the selection of cells from a library have been described. Examples of such descriptions are "Algorithms for Library-Specific Sizing of Combinational Logic," *27th Design Automation Conference*, pp. 353–356, 1990, by P. K. Chan, "A Cell-Based Approach to Performance Optimization of Fanout-Free Circuits," *IEEE Trans. Computer-Aided Design*, vol. 11 no. 10, pp. 1317–1321, October 1992, by U. Hinsberger and R. Kolla, and "Delay and Area Optimization in Standard-Cell Design," *27th Design Automation Conference*, pp. 349–352, 1990, by S. Lin, M. Marek-Sadowska, and E. S. Kuh. These solutions are restricted to combinatorial logic and, in some cases, restricted network topologies. Another limitation of these approaches is the simple delay model used during analysis. Without the close ties to the routed layout and accurate timing analysis the accuracy of the selection method will be poor. This is especially true in large designs and advanced process technologies where the percentage of delay due to routing is large, and where the selection of drive strength is critical.

SUMMARY OF THE INVENTION

This invention is a new approach to performance-driven layout that selects buffer sizes for a module generator-based automatic layout system. Accurate data on path delays are calculated through static timing analysis. This approach has several advantages, including:

Strong control over path delays through buffer sizing.

Accurate calculation of path delays including those due to routing parasitics.

Low computational complexity, which allows automatic, full-chip optimization.

In one aspect, the invention is a method for achieving timing constraints while optimizing the layout of an integrated circuit by sizing devices on the integrated circuit, where the integrated circuit has an associated net list having predetermined specifications and the devices are chosen from a predetermined set of devices. The method comprises the steps of a) replacing the minimal-sized devices in the first layout with nominal-sized devices to accommodate the capacitive load, b) generating estimated wiring capacitances associated with the net list, and c) calculating delays associated with the estimated wiring capacitances. The method further comprises the steps of d) performing a first timing analysis on the net list based on the delays associated with the estimated wiring capacitances to determine any violations of the predetermined specifications caused by the delays, and e) determining weights to apply to critical nets on a critical path, the critical nets being nets on the critical path that do not meet the predetermined specifications, the critical path being the set of instances of the devices creating a logical path to a point in the circuit where a timing violation occurs.

In addition, the method comprises the steps of f) performing a second place and routing step with the critical nets weighted, g) calculating delays along one of the critical nets, and h) identifying the most critical improvable paths in the net list and the instances of the devices along the most critical improvable paths, the most critical improvable paths being those having the largest timing violations. Further the method comprises the steps of i) allocating delays to instances on the most critical improvable paths so that the area added to the layout is minimized, j) generating a new layout having changed the device sizes of instances on the critical path to meet allocated delays, and k) updating the delays of instances affected by changes in the sizes of devices along the entire most critical improvable path. Still further, the method comprises the steps of l) reidentifying the most critical improvable path, m) performing the steps i)–l) until either: i) all constraints are met, or ii) no further improvement in the most critical improvable paths is possible, and o) performing a final rerouting of the layout.

In another aspect, the invention is an apparatus for achieving timing constraints while optimizing the layout of an integrated circuit by sizing devices on the integrated circuit, the integrated circuit having an associated net list having predetermined specifications and the devices being chosen from a predetermined set of devices. The apparatus comprises a circuit to replace the minimal-sized devices in the first layout with nominal-sized devices to accommodate the capacitive load, a circuit to generate estimated wiring capacitances associated with the net list, a circuit to calculate delays associated with the estimated wiring capacitances, and a circuit to perform a first timing analysis on the net list based on the delays associated with the estimated wiring capacitances to determine any violations of the predetermined specifications caused by the delays.

The apparatus further comprises a circuit to determine weights to apply to critical nets on a critical path, the critical nets being nets on the critical path that do not meet the predetermined specifications, the critical path being the set of instances of the devices creating a logical path to a point in the circuit where a timing violation occurs, a circuit to perform a second place and routing step with the critical nets weighted, a circuit to calculate delays along one of the critical nets, and a circuit to identify the most critical improvable paths in the net list and the instances of the devices along the most critical improvable paths, the most critical improvable paths being those having the largest timing violations. In addition, the apparatus comprises a first iterative circuit to allocate delays to instances on the most critical improvable paths so that the area added to the layout is minimized, a second iterative circuit to generate a new layout having changed the device sizes of instances on the critical path to meet allocated delays, a third iterative circuit to update the delays of instances affected by changes in the sizes of devices along the entire most critical improvable path, and a fourth iterative circuit to reidentify the most critical improvable path. The apparatus also comprises a circuit for operating the first, second, third and fourth iterative circuits until either i) all constraints are met, or ii) no further improvement in the most critical improvable paths is possible, and a circuit to perform a final rerouting of the layout.

DETAILED DESCRIPTION OF THE PREFERRED EMBODIMENT

Figure 1:
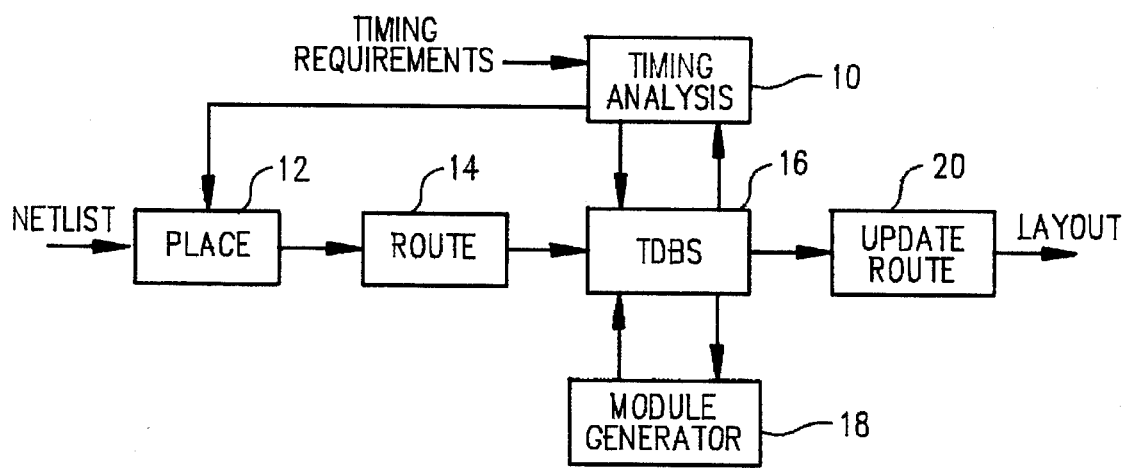
FIG. 1 is a diagram of the overall system flow of the method of the invention.

The overall system flow is shown in FIG. 1. The central step, timing driven buffer sizing, is abbreviated TDBS. The performance constraints for the integrated circuit are selected at the beginning of operation of the computer program. This is accomplished through the definition of timing requirements for the timing analysis (step 10). The designer-user specifies the clock signals and their characteristics (frequency, duty cycle, pulse width, and other clock signal parameters known to those skilled in the art of electronic design) and primary input arrival times, rise/fall rates, and required arrival times for primary outputs. The result is to define the arrival times and external loading of the primary outputs of the layout. This enables the accurate calculation of delays, allocation of delay to minimize the active area of the layout, the use of module generators to create new cells, and generation of cells having the requested drive strength.

The input net list is automatically placed and routed (steps 12 and 14, respectively). One approach to the steps 12 and 14 (which can be combined) is described in "Integrated Placement for Mixed Macro Cell and Standard Cell Designs," 27th Design Automation Conference, p. 32–35, 1990, by M. Upton, K. Samii, and S. Sugiyama. In this approach, an optional timing-driven placement can be requested by the user. This will cause an initial timing analysis based on fanout loads and will add weights to nets that are considered to be on performance-critical paths. These steps make moderate improvements in the design performance as shown in the results below.

Figure 2:
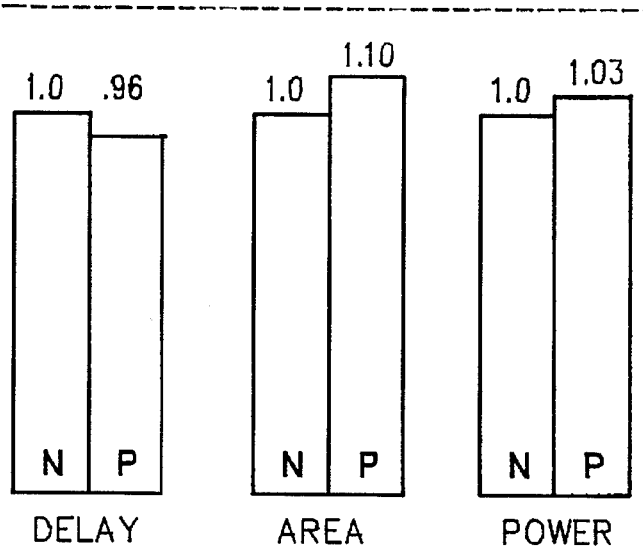
FIG. 2 is an illustration of typical results of the timing-device placement step.

In this prior art approach, after placement and routing, the routing parasitics can be calculated accurately (step 16), and delay, area, and power can be calculated. Typical results of the timing-device placement step described above (step 12) are shown in FIG. 2. The delay through a net may be decreased by four percent while the area and power consumption are respectively increased by ten and three percent.

Based on the accurate delay data developed from the routing parasitics, the invention system improves on the prior art by calling module generators (step 18) to build cells with the output drive strength required to meet the performance goals, frequently modifying buffer sizes. A final rerouting phase (step 20) completes the chip layout by making minor adjustments in the placement of the cells to accommodate any incremental changes in overall cell area caused by the new buffer sizes.

A prior art module generator (used in step 18) creates cell layouts and simulation data for the cell layouts. In this approach, the module generator is called a structural silicon compiler. The generators are written in a conventional layout language with a relative grid architecture, such as that described in "Module Generation and Silicon Compilation," by Daniel D. Gajski and Y-L. Steve Lin, in *Physical Design Automation of VLSI Systems*, eds. B. Preas and M. Lorenzetti, pp. 283–345, The Benjamin/Cummings Publishing Company, Menlo Park, Calif. 1988. One of the advantages that a module generator has over a fixed library of cells is the ability to resize the cell output drive strength based on parameters (such as activity parameters and parameters predetermining circuit performance) passed to the program.

In the present invention, the module generators (step 18) accept the various parameters and generate design data, including cell layout and timing models. All of the module generators accept a buffer size parameter that specifies the output impedance.

Figure 3:
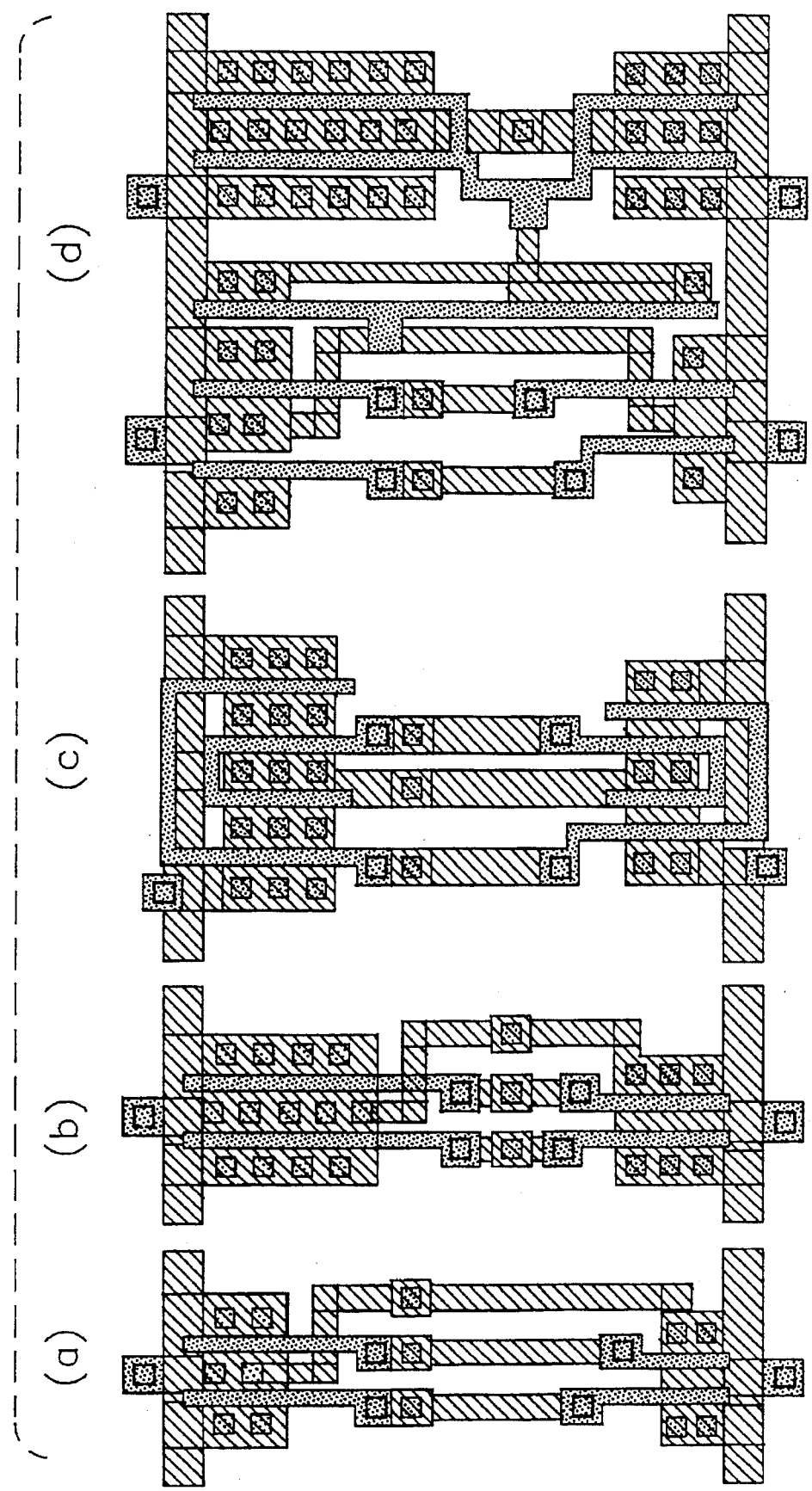
FIGS. 3(a)–3(d) illustrate an example of a 2-input NAND gate with several output buffer sizes.

A module generator may use different circuit implementations to meet the output drive requirements. FIG. 3 shows an example of a 2-input NAND gate with several output buffer sizes. By increasing the sizes of the devices in the gate shown in FIG. 3(a) to arrive at the gate in FIG. 3(b), adding a buffer Stage to arrive at the gate in FIG. 3(c), and finally adding parallel output devices to arrive at the gate in FIG. 3(d), a wide range of increasing drive requirements for a 2-input NAND gate can be met. All of these layouts shown in FIGS. 3(a)–(d) implement the same function but have radically different cell areas, intrinsic delays, input parasitic loads, and power consumption. The buffer in FIG. 3(a) is configured to drive a standard load, while the buffer in FIG. 3(b) has half the impedance of the buffer in FIG. 3(a). The two buffers have approximately equal rise and fall times. It is desirable to have small granularity between the buffers in the set of devices from which the buffers in the layout can be chosen, as will be discussed subsequently.

Although FIG. 3 shows a standard cell layout for a 2-input NAND gate, conventional module generators can also create cells for datapaths and larger cells, such as RAMs and ROMs. All of these module generators have buffer size parameters.

Figure 4:
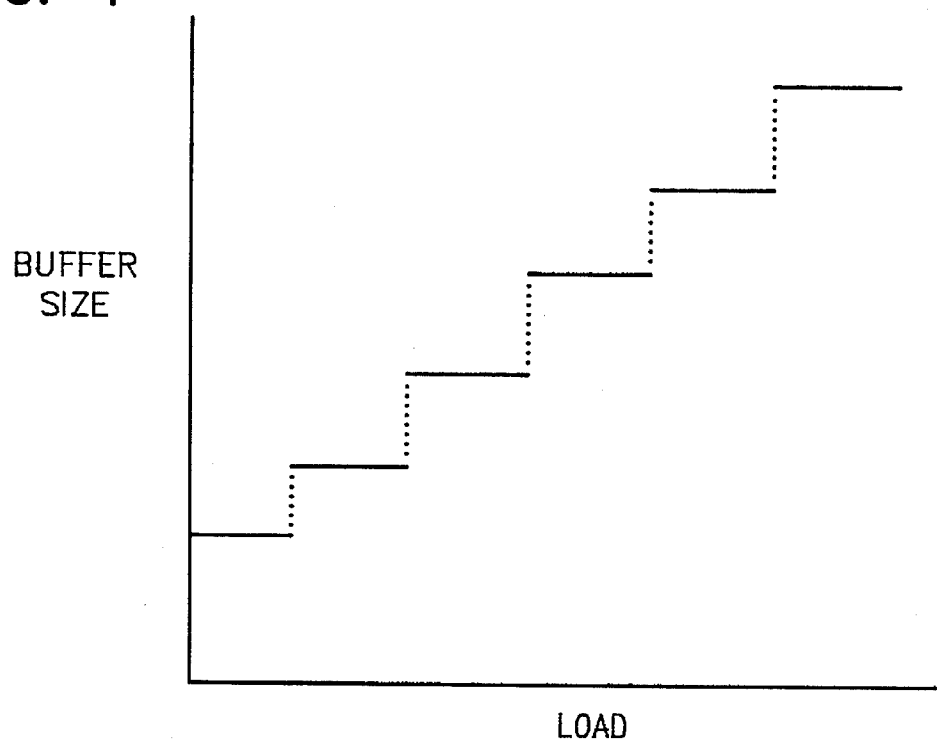
FIG. 4 is a plot of a nominal buffer size distribution as a function of load.
Figure 5:
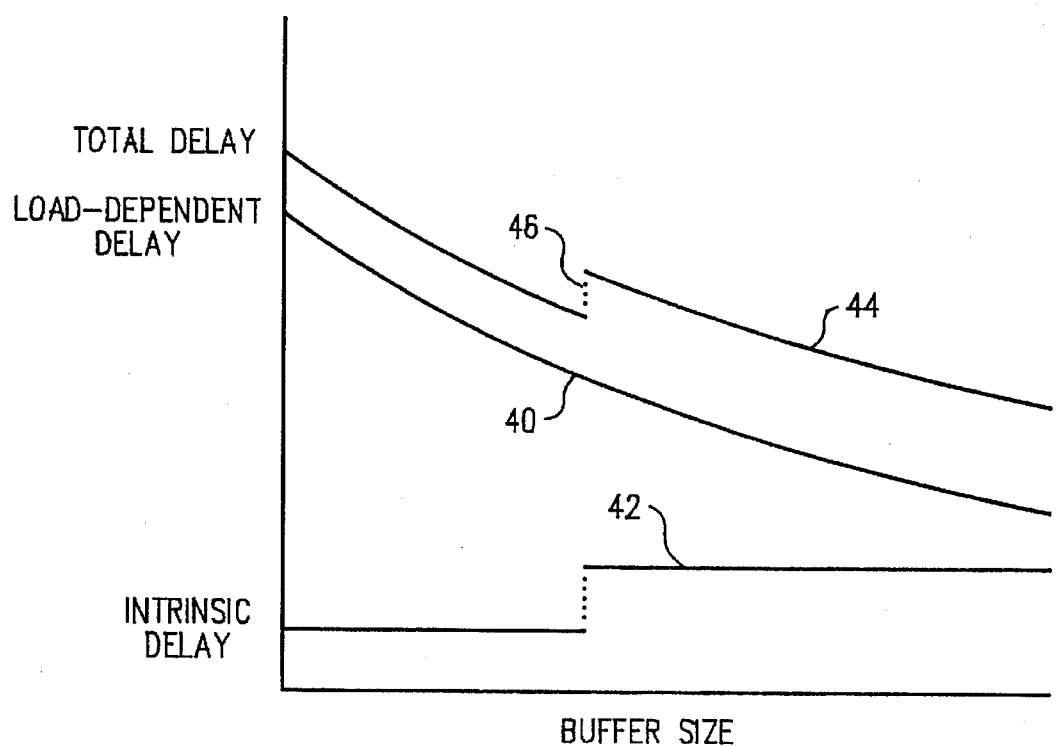
FIG. 5 is a plot of the typical distribution of delay as a function of buffer size.

FIG. 4 is a plot of a nominal buffer size distribution as a function of load. It shows that buffer size is an increasing monotonic function of load. FIG. 5 is a plot of the typical distribution of delay as a function of buffer size. It shows that the total delay can be a discontinuous, nonmonotonic function of buffer size. The total delay is the sum of the load-dependent delay (curve 40) and the intrinsic delay (curve 42) of the typical buffer. Adding the curves 40 and 42 produces the total delay curve 44, which is generally monotonically decreasing as a function of buffer size, but which has a discontinuity 46. This means that there can be two buffer sizes that have the same total delay. Accordingly, the appropriate choice of a buffer is typically a decision of the minimum-sized buffer which will provide the desired total delay.

The present invention extracts accurate timing information from a circuit by calling a timing analyzer (step 10 in FIG. 1). The timing analyzer operates on a conventional gate-level simulation database that includes accurate device sizes and layout parasitics. The timing analysis uses a conventional table-based delay calculator to compute pin-to-pin delays on each gate-level primitive instance. The pin-to-pin delays are interpolated from tables that are indexed based on gate type, input pin, device sizes, output load, and input edge rates. The data points in the tables are precalculated by running conventional SPICE simulations on extracted layouts. Interconnect delays are computed using an RC-tree approach, as described in "Signal Delay in RC Tree Networks," *IEEE Trans. Computer-Aided Design*, vol. CAD-2, no. 3, pp. 202–211, July 1983, by J. Rubinstein, P. Penfield Jr., and M. A. Horowitz.

Path delays are calculated, in conventional manners, from primary inputs to registers (storage elements), between registers, and from primary inputs to primary outputs. Registers may be a mix of edge-clocked flip-flops and level-sensitive latches. Since input rise and fall times are used in the delay calculation, data is propagated through the network beginning at the primary inputs and clocks.

The program that implements the method of the present invention communicates with the timing analysis routines through a shared data structure. This allows the program to update the layout and quickly compute and re-calculate the layout's delays. The delays are approximated with a linear equation and the area and power of a layout are modeled as functions of device size. The optimization problem solved is to meet total path delay while minimizing area and power. The delay allocation is related to the load distribution along the path of concern.

Figure 6:
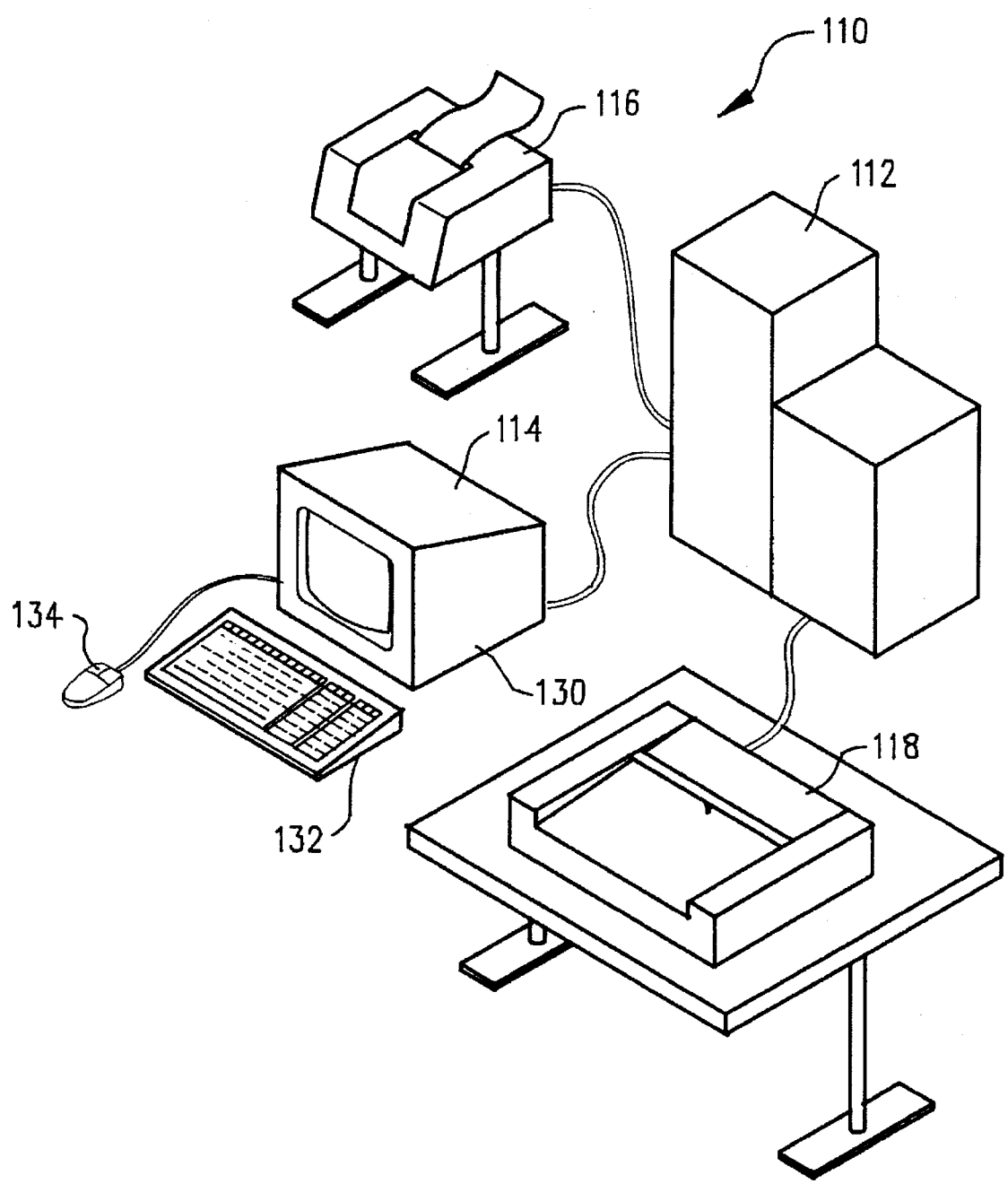
FIG. 6 is a schematic diagram of an exemplary computer system known in the prior art for accomplishing the desired results of the method and apparatus of the present invention.

FIG. 6 is a schematic diagram of an exemplary computer system known in the prior art for accomplishing the desired results of the method and apparatus of the present invention. The computer system 110 includes a computer 112, a terminal 114, a printer 116 and a plotter 118. The terminal 114 includes a display device 130 for displaying both graphical and textual materials relating to the design of the integrated circuit, and a keyboard 132 and a pointing device 134 (for example, a "mouse"). The keyboard 132 and the pointing device 134 are useful for inputting data to the computer system 110, possibly in response to prompts from the computer system 110, which are displayed on the display device 130. In one embodiment the computer 112 is a VAX 11/785, model no. 11785AA, manufactured by Digital Equipment Corporation (DEC), the terminal 114 is an AED 767 monitor terminal manufactured by Advanced Electronic Design, Inc., and the printer 116 may be any one of a large number of available models, and the plotter 118 is an HP 7475A, manufactured by Hewlett-Packard, Inc. The VAX 11/785 uses a UNIX version 4.2 operating system and includes an interface program for the AED 767 monitor called "Caesar version 7," developed at the University of California at Berkeley, and a "C" program language generated, developed by Bell Laboratories. In the preferred embodiment, the method for designing integrated circuits is embodied within a Generator Development System (GDS).

The computer system 110 includes a set of software tools for designing integrated circuit module generators, each consisting of source code and executable code. When operating with the software tools, which program the computer 112 to perform predetermined operations, the computer system 110 becomes essentially a series of electronic circuits for accomplishing specific design functions. The integrated circuit model is an array of cells. Each cell, in turn, is the geometric definition of the required integrated circuit components. Every module can be combined, like a building block, with other modules in order to create a complete geometric description of an integrated circuit and a corresponding mask work.

The preferred embodiment of the software is, in effect, the implementation of a high-level software language referred to as the "Silicon Generator Software Language for Integrated Circuits" (SLIC). However, it will be recognized by those skilled in the art that the software to accomplish the present invention can take other forms, including only portions of the software to be described. Each SLIC command comprises, in one embodiment, a set of "C" language function calls. Thus, the software is a language for writing source code which is to generate executable code. Execution of the executable code results in a specific geometry layout.

Method

The approach taken by the inventive program is to use a heuristic that performs driver sizing one path at a time. Paths are automatically selected in sequence by comparing the timing requirements of the paths to the actual delay of the paths. Changing the delay on a path is accomplished by calling the module generator (step 18) to build a new version of the cell with modified drive device sizes. After each path is "fixed," timing analysis is performed (step 10) to find the next most critical path according to the updated delays.

The basic method of the invention is to:

1. Size buffers to minimize area and power dissipation while keeping rise-fall times within an acceptable range.

2. Find the most critical path in the circuit by calling timing analysis (step 10).

3. Exit if the path delay is less than the specified timing constraint.

4. Allocate target delays for cells on the most critical path, as described by Obermeier, et al. and Chen et al., cited above.

5. Call the module generator (step 18) to generate a new version of each cell instance on the path that does not meet the target delay and replace the cell instance. If no improvement is possible, record the failed path.

6. Find the next most critical path in the circuit by calling timing analysis (step 10), and go to step 3.

The allocation of target delays in step 4 is based on the concept of controllable delay. The total controllable delay for a path is the target path delay minus the intrinsic delays of each logic stage. This is the amount of time available for the load-dependent delays. Each stage's controllable delay depends directly on the buffer size selected and is a function of the drive resistances and the total driver capacitance.

The allocation of controllable delay to each instance along a path while minimizing area is based on a published formula, shown in "A Deterministic Algorithm for Automatic CMOS Transistor Sizing," *IEEE J. Solid-State Circuits*, vol. 23, no. 2, pp. 522–526, April 1988, by B. A. Richman, J. E. Hansen, and K. Cameron. The inventors have found it to be important to reanalyze the circuit and iterate if necessary. This is because buffer sizing affects the intrinsic delay of the cell being replaced, the load-dependent delay of the previous stage, and the rise/fall-rate-dependent delays of gates in the following stage in a manner that is not directly determinable.

Since each cell can be part of multiple paths, the delay allocation must also ensure that the allocated delay is less than or equal to the existing delay. This will keep the program from lengthening a previously optimized path, and will guarantee that the program will converge to a solution.

RESULTS

Results from example designs are given in Tables 1 and 2. The buffer sizes of the layout before the program is applied were chosen to keep the output rise and fall times within an acceptable range.

TABLE 1

| | Negative Slack Time | | | | |
|---|---|---|---|---|---|
| DESIGN | TARGET | A.OPT. | T.OPT. | TDBS | % Imp. |
| cpu | 35.0 | 23.6 | 19.0 | 8.8 | 25.1 |
| bdcalu | 15.0 | 28.9 | 25.0 | 0.8 | 64.0 |
| m8254 | 60.0 | 10.2 | 6.1 | 2.9 | 10.4 |
| t3instmcn | 20.0 | 71.6 | 70.0 | 9.5 | 24.1 |
| pdct | 90.0 | 70.2 | 62.4 | 4.5 | 41.0 |

Table 1 shows the change in timing performance. All times are given in nanoseconds. Each entry lists the target longest path delay, the negative slack time after running area-optimized placement (A.Opt.), timing-driven placement (T.Opt.), and the program of the present invention (TDBS), and the percentage improvement in the longest path delay. The target delays were set to be slightly below delays that the program could reach so that the method would not terminate early.

Negative slack is the amount of time by which the longest path delay exceeds the target delay. Therefore the actual longest path delay is the sum of the target delay and the negative slack time. The average reduction in the longest path delay in these examples is 32.9 percent. Timing-driven placement is responsible for an average improvement of 5.90% and the inventive computer program achieves an average improvement of 27.0%.

TABLE 2

| DESIGN | A.OPT. | T.OPT. | TDBS | Cells | CPU |
|---|---|---|---|---|---|
| cpu | 14252 | 14848 | 14666 | 314 | 242 |
| bdcalu | 5126 | 5133 | 5310 | 564 | 113 |
| m8254 | 2941 | 2955 | 3148 | 430 | 146 |
| t3instmcn | 666 | 625 | 691 | 673 | 1122 |
| pdct | 22873 | 23208 | 22796 | 1329 | 576 |

Table 2 shows the change in total routed area for each of the example designs. The relative areas between designs is not meaningful since each is implemented in different process design rules, but the average increase in area after using the inventive computer program is 3.4 percent.

Also listed in Table 2 are the number of cells in the example designs and the running time for the inventive computer program. The times are CPU seconds for Sun SPARC station 10/30 workstation. They include the total amount of CPU time required by the inventive computer program and module generation.

The complexity of the inventive method is $O(n^2)$ for each path that is optimized, where n is the number of cells in the path. This is due to the fact that the program updates the path delays and iterates after buffer sizing each path. In practice the average running time is often close to $O(n)$. Since the method only runs on paths that exceed their target delays, designs that start out close to meeting their performance goals are processed quickly.

We claim:

1. A method for achieving timing constraints while optimizing the layout of an integrated circuit by sizing devices on the integrated circuit, the integrated circuit having an associated net list having predetermined specifications and the devices being chosen from a predetermined set of devices, each having a resistance and a capacitance, the predetermined set of devices including a minimal-sized device having a minimal area and a nominal-sized device having a nominal area that is larger than the minimal area of the minimal-sized device, the method comprising the steps of:

a) replacing any minimal-sized devices in a first layout with nominal-sized devices to accommodate the capacitive load;
  b) generating estimated wiring capacitances associated with the net list;
  c) calculating delays associated with the estimated wiring capacitances;
  d) performing a timing analysis on the net list based on the delays associated with the estimated wiring capacitances to determine any violations of the predetermined specifications caused by the delays;
  e) determining weights to apply to critical nets on a critical path, the critical nets being nets on the critical path that do not meet the predetermined specifications, the critical path being the set of instances of the devices creating a logical path to a point in the circuit where a timing violation occurs;
  f) performing a place and routing step with the critical nets weighted to place the devices on the integrated circuit and to route paths among the devices;
  g) calculating delays along one of the critical nets;
  h) identifying the most critical improvable paths in the net list and the instances of the devices along the most critical improvable paths, the most critical improvable paths being those having the largest timing violations;
  i) allocating delays to instances on the most critical improvable paths so that the area added to the layout in performing step a) for the instances on the most critical improvable paths is minimized;
  j) generating a new layout including devices whose area has been changed after having changed the areas of instances of the devices on the critical path to meet the allocated delays;
  k) updating the delays of instances of the devices affected by changes in the areas of instances of the devices along the entire most critical improvable path;
  l) reidentifying the most critical improvable paths in the net list;
  m) performing the steps i)–l) until either:
    i) all constraints are met, or
    ii) no further improvement in the most critical improvable paths is possible; and
  n) performing a final rerouting of the layout.

2. The method of claim 1 wherein step i) further comprises allocating the delays based on the resistances and capacitances of the instances on the most critical improvable paths.

3. The method of claim 2 wherein the resistances and capacitances of the instances on the most critical improvable paths are functions of the width and length of the instances.

4. The method of claim 2 wherein the devices are buffers.

5. The method of claim 1 wherein the devices are buffers.

6. A method for achieving timing constraints while optimizing the layout of an integrated circuit by sizing devices on the integrated circuit, the integrated circuit having an associated net list having predetermined specifications and the devices being chosen from a predetermined set of devices, each device having a resistance, a capacitance, an area and at least one output transistor, the method comprising the steps of:

a) generating estimated wiring capacitances associated with the net list;
  b) calculating delays associated with the estimated wiring capacitances;
  c) performing a timing analysis on the net list based on the delays associated with the estimated wiring capacitances to determine any violations of the predetermined specifications caused by the delays;
  d) determining weights to apply to critical nets on a critical path, the critical nets being nets on the critical path that do not meet the predetermined specifications, the critical path being the set of instances of the devices creating a logical path to a point in the circuit where a timing violation occurs;
  e) performing a place and routing step with the critical nets weighted to place the devices on the integrated circuit and to route paths among the devices;
  f) calculating delays along one of the critical nets;
  g) identifying the most critical improvable paths in the net list and the instances of the devices along the most critical improvable paths, the most critical improvable paths being those having the largest timing violations;
  h) allocating delays to instances on the most critical improvable paths;
  i) generating a new layout, including substituting devices on the critical paths with other devices in the predetermined set that have different areas in order to meet the delays allocated in step h);
  j) updating the delays of instances affected by the changes in the areas of the devices along the entire most critical improvable path;
  k) reidentifying the most critical improvable paths in the net list;
  l) performing the steps h)–k) until either:
    I) all constraints are met, or
    ii) no further improvement in the most critical improvable paths is possible; and
  m) performing a final rerouting of the layout.

7. The method of claim 6 wherein step h) further comprises allocating the delays based on the resistances and capacitances of the instances on the most critical improvable paths.

8. The method of claim 7 wherein the resistances and capacitances of the instances on the most critical improvable paths are functions of the width and length of the output transistors of the instances.

9. The method of claim 7 wherein the devices are buffers.

10. The method of claim 6 wherein the devices are buffers.

11. A method for achieving timing constraints while optimizing the layout of an integrated circuit by sizing devices on the integrated circuit, the integrated circuit having an associated net list having predetermined specifications and the devices being chosen from a predetermined set of devices, each device having a resistance, a capacitance, an area and at least one output transistor, the set including a minimal-sized device having a minimal area and a nominal-sized device having a nominal area that is larger than the minimal area of the minimal-sized device, the method comprising the steps of:

a) performing a first place and routing step on the net list using minimal-sized devices chosen from the predetermined set of devices, thereby producing a first layout;
  b) determining the capacitive load on the minimal-sized devices in the first layout;
  c) replacing the minimal-sized devices in the first layout with nominal -sized devices to accommodate the capacitive load;

d) generating estimated wiring capacitances associated with the net list;

e) calculating delays associated with the estimated wiring capacitances;

f) performing a timing analysis on the net list based on the delays associated with the estimated wiring capacitances to determine any violations of the predetermined specifications caused by the delays;

g) determining weights to apply to critical nets on a critical path, the critical nets being nets on the critical path that do not meet the predetermined specifications, the critical path being the set of instances of the devices creating a logical path to a point in the circuit where a timing violation occurs;

h) performing a second place and routing step with the critical nets weighted;

i) calculating delays along one of the critical nets;

j) identifying the most critical improvable paths in the net list and the instances of the devices along the most critical improvable paths, the most critical improvable paths being those having the largest timing violations;

k) allocating delays to instances on the most critical improvable paths so that the area added to the layout in performing step c) for the instances on the most critical improvable paths is minimized;

l) generating a new layout including devices whose size has been changed after having changed the areas of instances of the devices on the critical path to meet the allocated delays;

m) updating the delays of instances affected by changes in the areas of instances of the devices along the entire most critical improvable path;

n) reidentifying the most critical improvable paths in the net list;

o) performing the steps k)–n) until either:
   i) all constraints are met, or
   ii) no further improvement in the most critical improvable paths is possible; and p) performing a final rerouting of the layout.

12. The method of claim 11 wherein step k) further comprises calculating the delays based on the resistances and capacitances of the instances on the most critical improvable paths.

13. The method of claim 12 wherein the resistances and capacitances of the instances on the most critical improvable paths are functions of the width and length of the output transistors of the instances.

14. The method of claim 12 wherein the devices are buffers.

15. The method of claim 11 wherein the devices are buffers.

16. An apparatus for achieving timing constraints while optimizing the layout of an integrated circuit by sizing devices on the integrated circuit, the integrated circuit having an associated net list having predetermined specifications and the devices being chosen from a predetermined set of devices, each having an area, a resistance and a capacitance, the predetermined set of devices including a minimal-sized device having a minimal area and a nominal-sized device having a nominal area that is larger than the minimal area of the minimal-sized device, the apparatus comprising:

a programmed circuit to replace any minimal-sized devices in a first layout with nominal-sized devices to accommodate the capacitive load;

a programmed circuit to generate estimated wiring capacitances associated with the net list;

a programmed circuit to calculate delays associated with the estimated wiring capacitances;

a programmed circuit to perform a timing analysis on the net list based on the delays associated with the estimated wiring capacitances to determine any violations of the predetermined specifications caused by the delays;

a programmed circuit to determine weights to apply to critical nets on a critical path, the critical nets being nets on the critical path that do not meet the predetermined specifications, the critical path being the set of instances of the devices creating a logical path to a point in the circuit where a timing violation occurs;

a programmed circuit to perform a place and routing step with the critical nets weighted to place the devices on the integrated circuit and to route paths among the devices;

a programmed circuit to calculate delays along one of the critical nets;

a programmed circuit to identify the most critical improvable paths in the net list and the instances of the devices along the most critical improvable paths, the most critical improvable paths being those having the largest timing violations;

a first iterative circuit to allocate delays to instances on the most critical improvable paths so that the area added to the layout by the programmed circuit to replace any minimal-sized devices in a first layout with nominal-sized devices to accommodate the capacitive load for the instances on the most critical improvable paths is minimized;

a second iterative circuit to generate a new layout including devices whose area has been changed after having changed the areas of instances of the devices on the critical path to meet allocated delays;

a third iterative circuit to update the delays of instances of the devices affected by changes in the areas of instances of the devices along the entire most critical improvable path;

a fourth iterative circuit to reidentify the most critical improvable paths in the net list;

a programmed circuit for operating the first, second, third and fourth iterative circuits until either i) all constraints are met, or ii) no further improvement in the most critical improvable paths is possible; and a programmed circuit to perform a final rerouting of the layout.

* * * * *